US012213261B2

(12) United States Patent
Oesterling et al.

(10) Patent No.: US 12,213,261 B2
(45) Date of Patent: Jan. 28, 2025

(54) PROTECTIVE ENCLOSURE FOR AN ELECTRONIC DEVICE

(71) Applicant: GM GLOBAL TECHNOLOGY OPERATIONS LLC, Detroit, MI (US)

(72) Inventors: Christopher L. Oesterling, Troy, MI (US); Bernard V. Laurus, Canton, MI (US); Donald Eng, Markham (CA); Jarvis Chau, Markham (CA); Michael A. Celotto, Linden, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 91 days.

(21) Appl. No.: 18/342,111

(22) Filed: Jun. 27, 2023

(65) Prior Publication Data

US 2025/0008668 A1 Jan. 2, 2025

(51) Int. Cl.
*G06F 1/16* (2006.01)
*B60R 16/023* (2006.01)
*H05K 5/00* (2006.01)
*H05K 7/00* (2006.01)

(52) U.S. Cl.
CPC ....... *H05K 5/0056* (2013.01); *B60R 16/0239* (2013.01)

(58) Field of Classification Search
CPC .. H05K 5/0056; H05K 5/0047; H05K 5/0043; H05K 5/0034; H05K 5/003; H05K 5/0026; H05K 5/006; B60R 16/0239; B60R 16/023; B60R 16/03; B60R 16/02
See application file for complete search history.

(56) References Cited

U.S. PATENT DOCUMENTS

| 7,480,149 | B2 * | 1/2009 | DeWard | H04N 23/54 361/728 |
|---|---|---|---|---|
| 9,352,692 | B2 * | 5/2016 | Uken | B60R 19/28 |
| 9,487,159 | B2 * | 11/2016 | Achenbach | B60R 11/04 |
| 9,896,039 | B2 * | 2/2018 | Achenbach | B60R 1/24 |
| 2012/0229882 | A1 * | 9/2012 | Fish, Jr. | G02F 1/157 359/267 |
| 2014/0160284 | A1 * | 6/2014 | Achenbach | H04N 23/57 29/854 |
| 2017/0171952 | A1 * | 6/2017 | Troutman | B60Q 11/005 |
| 2017/0217388 | A1 * | 8/2017 | Ghannam | H05K 5/061 |
| 2018/0009377 | A1 * | 1/2018 | Troutman | B60R 16/023 |
| 2018/0152609 | A1 * | 5/2018 | Wang | B60R 11/04 |

* cited by examiner

*Primary Examiner* — Anthony M Haughton
(74) *Attorney, Agent, or Firm* — Quinn IP Law

(57) ABSTRACT

A protective enclosure for an electronic control unit (ECU) to minimize risk of environmental intrusion includes a base portion, a first housing, a second housing, a first gasket, a vibration attenuating insert, a first electrical connector, a second electrical connector, a third electrical connector, and a tether. The first housing is sealably assembled onto the base portion, and the first housing and the base portion define a first chamber to house the telematics module. The second housing and the base portion define a second chamber. The tether attaches the base portion and the second housing.

20 Claims, 3 Drawing Sheets

PROTECTIVE ENCLOSURE FOR AN ELECTRONIC DEVICE

INTRODUCTION

Electronic control units (ECUs) employed on vehicles have been designed for in-vehicle cabin installation, with minimal protection from harsh environmental elements such as rain, dirt, vibration, etc.

SUMMARY

There is a need for a protective enclosure that has been arranged to package an electronic control unit (ECU) to minimize or eliminate risk of intrusion of environmental elements such as water, dirt, vibration, etc., which may be encountered when an ECU is employed in a non-automotive vehicle application.

An aspect of the disclosure may include an enclosure for a telematics module that includes a base portion, a first housing, a second housing, a first gasket, a vibration attenuating insert, a first electrical connector, a second electrical connector, a third electrical connector, and a tether. The first housing is sealably assembled onto the base portion with the first gasket interposed therebetween, and the first housing and the base portion define a first chamber that is arranged to house the telematics module and the vibration attenuating insert. The second housing and the base portion define a second chamber. The first housing includes a first end, and the first chamber adjoins the second chamber at the first end of the first housing. The first electrical connector, the second electrical connector, and the third electrical connector are arranged in the first end of the first housing, including a first end of the first electrical connector, a first end of the second electrical connector, and a first end of the third electrical connector being disposed in the first chamber, and a second end of the first electrical connector, a second end of the second electrical connector, and a second end of the third electrical connector being disposed in the second chamber. The second housing and the base portion cooperate to define a first aperture, a second aperture, and a third aperture that are arranged on a second end of the second housing, which includes the second housing and the base portion having a first sealable strain relief portion associated with the first aperture, wherein the first aperture accommodates a wiring harness cable; the second housing and the base portion having a second sealable strain relief portion associated with the second aperture, wherein the second aperture accommodates a first coaxial cable; and the second housing and the base portion having a third sealable strain relief portion associated with the third aperture, wherein the third aperture accommodates a second coaxial cable. The tether attaches the base portion and the second housing.

Another aspect of the disclosure may include the first electrical connector being a multi-pin connector.

Another aspect of the disclosure may include the second electrical connector being a radiofrequency (RF) connector.

Another aspect of the disclosure may include the third electrical connector being a radiofrequency (RF) connector.

Another aspect of the disclosure may include the first gasket being fabricated from a silicone material.

Another aspect of the disclosure may include a second gasket; wherein the second housing is assembled onto the base portion with the second gasket interposed therebetween.

Another aspect of the disclosure may include a tether; wherein the tether is attached to the base portion and the second housing, and wherein the tether is disposed internal to the second chamber.

Another aspect of the disclosure may include a drain, wherein the drain is disposed on the base portion within the second chamber.

Another aspect of the disclosure may include the first aperture accommodating a wiring harness cable, the second aperture accommodating a first coaxial cable, and the third aperture accommodating a second coaxial cable.

Another aspect of the disclosure may include an enclosure for a telematics module that includes a base portion, a first housing, a second housing, a first gasket, a vibration attenuating insert, a first electrical connector, and a second electrical connector. The first housing is sealably assembled onto the base portion with the first gasket interposed therebetween, and the first housing and the base portion define a first chamber that is arranged to house the telematics module and the vibration attenuating insert. The second housing and the base portion define a second chamber. The first housing includes a first end, and the first chamber adjoins the second chamber at the first end of the first housing. The first electrical connector and the second electrical connector are sealably arranged in the first end of the first housing, including a first end of the first electrical connector and a first end of the second electrical connector being disposed in the first chamber, and a second end of the first electrical connector and a second end of the second electrical connector being disposed in the second chamber.

Another aspect of the disclosure may include an enclosure for a solid-state electronics module that includes a base portion, a first housing, a second housing, a first gasket, a vibration attenuating insert, a first electrical connector, and a second electrical connector, wherein the first housing is sealably assembled onto the base portion with the first gasket interposed therebetween, and wherein the first housing and the base portion define a first chamber that is arranged to house the electronics module and the vibration attenuating insert. The second housing and the base portion define a second chamber. The first housing includes a first end, and the first chamber adjoins the second chamber at the first end of the first housing. The first electrical connector and the second electrical connector are sealably arranged in the first end of the first housing, including a first end of the first electrical connector and a first end of the second electrical connector being disposed in the first chamber, and a second end of the first electrical connector and a second end of the second electrical connector being disposed in the second chamber.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the claims.

BRIEF DESCRIPTION OF THE DRAWINGS

One or more embodiments will now be described, by way of example, with reference to the accompanying drawings, in which.

Figure 1:
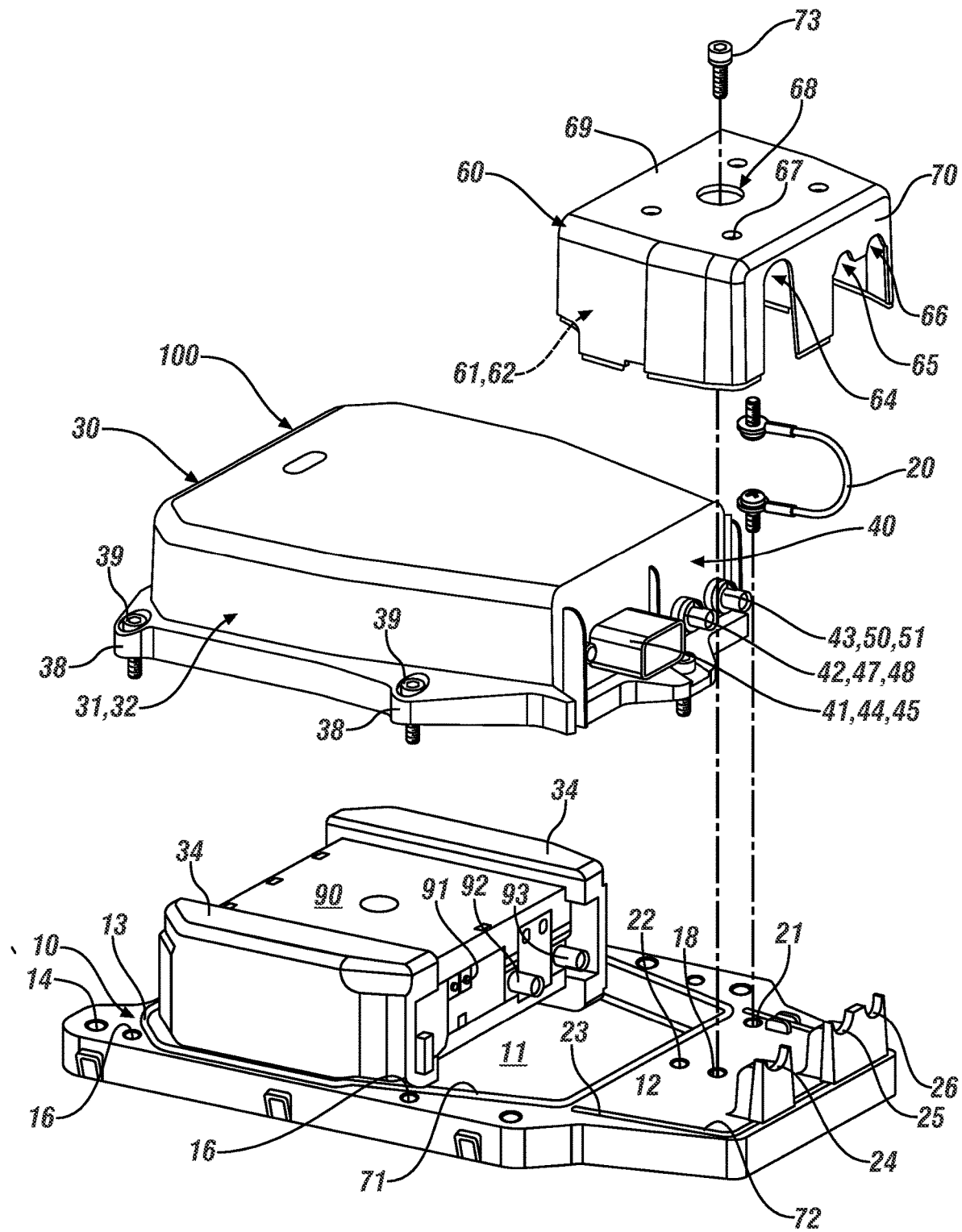
FIG. 1 is an exploded isometric top-side view of an enclosure for a telematics module, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments may be practiced without some of these details. Moreover, for the purpose of clarity, certain technical material that is understood in the related art has not been described in detail in order to avoid unnecessarily obscuring the disclosure.

For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein.

The following detailed description is merely illustrative in nature and is not intended to limit the application and uses. Furthermore, there is no intention to be bound by expressed or implied theories being presented herein. Throughout the drawings, corresponding reference numerals indicate like or corresponding parts and features.

As used herein, the term "system" may refer to one of or a combination of mechanical and electrical actuators, sensors, controllers, application-specific integrated circuits (ASIC), combinatorial logic circuits, software, firmware, and/or other components that are arranged to provide the described functionality.

The use of ordinals such as first, second, and third does not necessarily imply a ranked sense of order, but rather may only distinguish between multiple instances of an act or structure.

Figure 2:
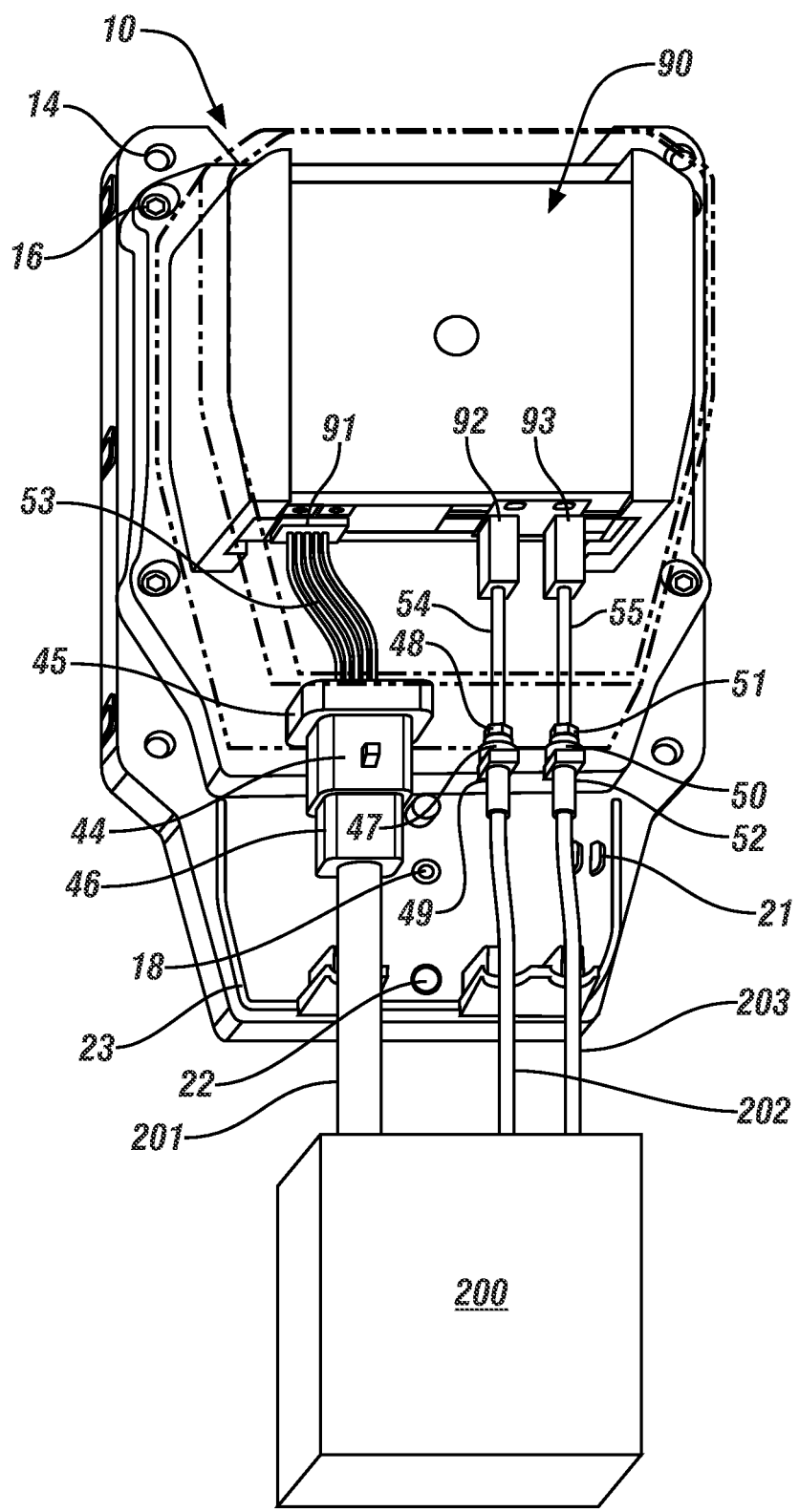
FIG. 2 is an isometric top-side view of a base portion of an enclosure for a telematics module, in accordance with the disclosure.
Figure 3:
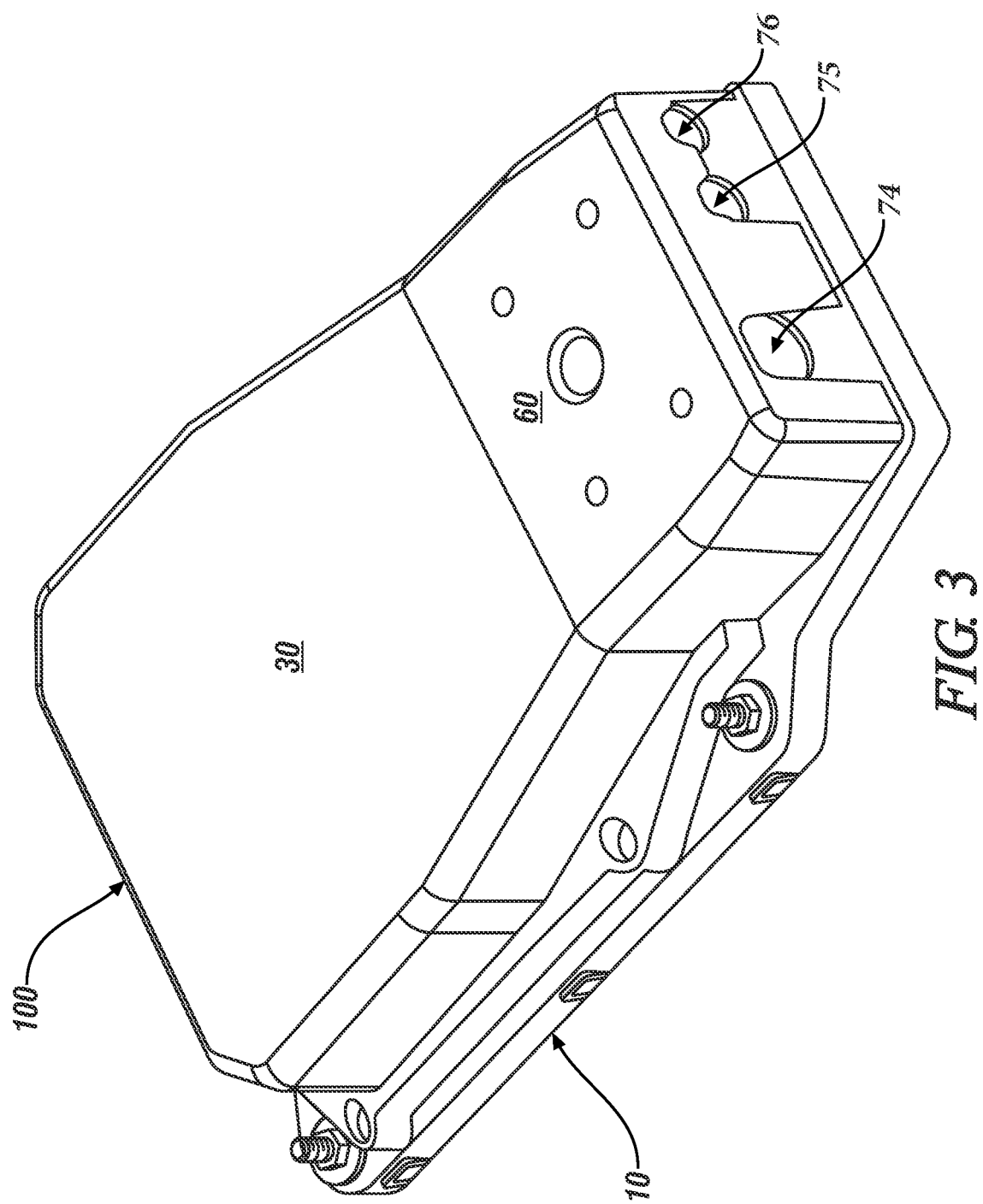
FIG. 3 is an isometric top-side view of an enclosure for a telematics module, in accordance with the disclosure.

Referring now to the drawings, wherein the depictions are for the purpose of illustrating certain embodiments only and not for the purpose of limiting the same, FIGS. 1, 2, and 3 schematically illustrate various aspects and elements of an enclosure 100 for an electronics module 90, which may be employed on a vehicle 200, wherein the enclosure 100 seals the electronics module 90 from dust and moisture intrusion while enabling coupling to wiring harnesses via connectors for communication and electrical power. The vehicle 200 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure.

The telematics module 90 is a stand-alone solid-state device that includes a wireless telematics communication system that is capable of performing extra-vehicle communications, including communicating with a communication network system having wireless and wired communication capabilities. The telematics module 90 is adapted for extra-vehicle communications that includes short-range ad hoc vehicle-to-vehicle (V2V) communication and/or vehicle-to-everything (V2x) communication, which may include communication with an infrastructure monitor, e.g., a traffic camera and ad hoc vehicle communication. Alternatively, or in addition, the telematics module 90 has a wireless telematics communication system adapted for short-range wireless communication to a handheld device, e.g., a cell phone, a satellite phone, or another telephonic device. In one embodiment, the telematics module 90 executes extra-vehicle communication, including communicating with an off-board server via a communication network that may include a satellite and/or another communication mode. Alternatively, or in addition, the telematics module 90 executes the extra-vehicle communication directly by communicating with the off-board server. In one embodiment, the telematics module 90 includes a cellular phone and a global positioning system (GPS) receiver. It may be connected to an AM/FM/XM radio, a microphone, a control panel, a GPS/mobile phone antenna, and a data link connector. The main tasks of the telematics module 90 may include, in one embodiment, voice and data communication via the mobile phone network; receipt of data signals from GPS to determine vehicle location; communication of bus messages to activate vehicle devices such as hazard warning lights and audible horns, receipt of bus messages to automatically call for assistance; reproduction of phone calls via the audio system speakers; disconnection of an audio system during a phone call; and communication of diagnostics information from the vehicle that has been received from the communication bus.

The enclosure 100 for the module 90 includes a base portion 10, a first housing 30, a second housing 60, a first gasket 71, a second gasket 72, a vibration attenuating insert 34, a first electrical connector 44, a second electrical connector 47, a third electrical connector 50, and a tether 20. The tether 20 is attached to the base portion 10 and the second housing 60.

The base portion 10, first housing 30, and second housing 60 are rigid structures that are fabricated from acrylic or other hardened polymer material with design features to assure structural rigidity.

The base portion 10 is a rigid structure that has a substantially planar form, and is fabricated from acrylic or other hardened polymer material with design features to assure rigidity. The base portion 10 includes a first area 11, a second area 12, a plurality of mounting bosses 14, a plurality of first housing attachment bosses 16, and a second housing attachment boss 18. In one embodiment, a backside of the base portion 10 includes a honeycomb arrangement to give structural rigidity thereto.

The first area 11 is designed to accommodate a side of the telematics module 90 and a portion of the vibration attenuating insert 34. The first area 11 is circumscribed by a first gasket recess 13, which accommodates the first gasket 71. The plurality of first housing attachment bosses 16 are arranged on the base portion 10 external to the first gasket recess 13 and the first area 11.

The second area 12 includes second attachment boss 18, a tether mount 21, a drain 22, and a second gasket recess 23 that accommodates a second gasket 72. The second attachment boss 18, the tether mount 21, and the drain 22 are circumscribed within the second area 12. The second area 12 also includes a first strain relief boss 24, a second strain relief boss 25, and in one embodiment a third strain relief boss 26, all of which project orthogonal from a surface of the base portion 10 within the second area 12. Alternatively, the base portion 10 includes the first strain relief boss 24 and the second strain relief boss 25.

The first housing 30 has a prismatic or modified prismatic shape that is opened on the bottom and forms a first recessed space 31.

The first recessed space 31 of the first housing 30 and the first area 11 of the base portion 10 define a first chamber 32 that is arranged to house, physically secure, and seal the telematics module 90 from dust and moisture intrusion, with the vibration attenuating insert 34 therein. The first housing attachment bosses 16 interface with first fasteners 39 and mounting bosses 38 to individually secure the first housing 30 onto the base portion 10 with the first gasket 71 interposed therebetween. In one embodiment, the first fasteners 39 are threaded screw fasteners arranged in the mounting bosses 38, and the first housing attachment bosses 16 includes threaded apertures that mate with the first fasteners 39 to exert a compressive force on the first gasket 71 and the first housing 30.

The first gasket 71 is fabricated from silicone, or another pliable sealing material. The first gasket 71 may be fabricated employing extrusion technology or molding technology, and may have a cross-section or profile that is round, oval, d-shaped, p-shaped, e-shaped, or another cross-sectional shape.

When assembled, the first chamber 32 is able to resist ingress of dust and moisture, and withstand high pressure, high temperature washdowns, as determined by a performance standard such as is set forth in ISO20653—(Road Vehicles). By way of example, the first chamber 32 is configured to be able to achieve an ingress protection rating of IP69K.

The second housing 60 has a prismatic or modified prismatic shape that is opened on the bottom and forms a second recessed space 61. The second housing 60 includes a mounting boss 68 and a tether attachment boss 67. The tether attachment boss 67 is disposed internal to the second recessed space 61, i.e., within a second chamber 62.

The second recessed space 61 of the second housing 60 and the second area 12 of the base portion 10 define the second chamber 62, which is arranged to house, physically secure, and seal the first, second, and third electrical connectors 44, 47, 50, along with associated first, second, and third vehicle connectors 201, 202, and 203, respectively.

A second fastener 73 passes through mounting boss 68 of the second housing 60, and interfaces with the second housing attachment boss 18 to secure the second housing 60 onto the base portion 10 with the second gasket 72 interposed therebetween. In one embodiment, the second fastener 73 is a threaded screw fastener, and the second housing attachment boss 18 includes a threaded aperture that mates with the second fastener 73 to exert a compressive force on the second housing 30 and the second gasket 72.

The second gasket 72 is fabricated from silicone, or another pliable sealing material. The second gasket 72 may be fabricated employing extrusion technology or molding technology, and may have a cross-section or profile that is round, oval, d-shaped, p-shaped, e-shaped, or another cross-sectional shape.

The tether attachment boss 67 is disposed internally to the second recessed space 61. One end of the tether 20 is attached to the tether mount 21 of the base portion 10 and the other end of the tether 20 is attached to the tether attachment boss 67 of the second housing 60. As such, the tether is contained within the second chamber 62 when the second housing 60 is assembled and secured onto the base portion 10.

The first housing 30 includes a first end 40 that adjoins the second recessed space 61 of the second housing 60, and thus the first recessed space 31 adjoins the second recessed space 61 with the first end 40 of the first housing 30 interposed therebetween.

The first end 40 of the first housing 30 includes, in one embodiment, a first aperture 41, a second aperture 42, and a third aperture 43, which are arranged to sealably accommodate a first electrical connector 44, a second electrical connector 47, and a third electrical connector 50, respectively.

A first end 45 of the first electrical connector 44, a first end 48 of the second electrical connector 47, and a first end 51 of the third electrical connector 50 are disposed in the first chamber 32.

A second end 46 of the first electrical connector 44, a second end 49 of the second electrical connector 47, and a second end 52 of the third electrical connector 50 are disposed in the second chamber 62.

The first electrical connector 44 is a multi-pin connector that includes wire cables for transferring electric power and wire cables for communication, including, e.g., a communication bus. The first end 45 of the first electrical connector 44 connects, via a first pigtail 53, to a first input 91 of the module 90 to transfer electric power thereto, and to communicate therewith, e.g., a communication bus. The second end 46 of the first electrical connector 44 projects into the second chamber 62, and is arranged to connect with the first mating connector 201 from vehicle 200.

The second electrical connector 47 is an RF connector for communication with a first RF antenna (not shown). The first end 48 of the second electrical connector 47 connects, via coaxial cable 54, to a first RF connector 92 of the module 90 for communication. The second end 49 of the second electrical connector 47 projects into the second chamber 62, and is arranged to connect with the second mating connector 202 from vehicle 200.

The third electrical connector 50 is an RF connector for communication with a second RF antenna (not shown). The first end 51 of the third electrical connector 50 connects, via coaxial cable 55, to a second RF connector 93 of the module 90 for communication. The second end 52 of the third electrical connector 50 projects into the second chamber 62, and is arranged to connect with the third mating connector 203 from vehicle 200.

The second housing 60 includes a first end 69 that is proximal to the first end 40 of the first housing 30, and a second end 70 that is distal from the first end 40 of the first housing 30.

The second end 70 of the second housing 60 includes a first strain relief opening 64, a second strain relief opening 65, and a third strain relief opening 66.

The first strain relief opening 64 of the second housing 60 and the first strain relief boss 24 of the base portion 10 cooperate to define a first strain relief aperture 74, which is employable to accommodate a cable connected to the first mating connector 201 from vehicle 200. In one embodiment, the cable connected to the first mating connector 202 from vehicle 200 is a multiwire cable that connects to a controller of the vehicle 200 and includes a communication bus and DC power cables and grounding.

The second strain relief opening 65 of the second housing 60 and the second strain relief boss 25 of the base portion 10 cooperate to define a second strain relief aperture 75, which is employable to accommodate a cable connected to the second mating connector 202 from vehicle 200. In one embodiment, the cable connected to the second mating connector 202 from vehicle 200 is a coaxial cable that connects to a first RF antenna.

The third strain relief opening 66 of the second housing 60 and the third strain relief boss 26 of the base portion 10 cooperate to define a third strain relief aperture 76, which is employable to accommodate a cable connected to the third mating connector 203 from vehicle 200. In one embodiment, the cable connected to the third mating connector 203 from vehicle 200 is a coaxial cable that connects to a second RF antenna.

The first, second, and third strain relief apertures 74, 75, 76 may also include a malleable gasket that elastically deforms around the respective cable when the second housing 60 is compressively assembled onto the base portion 10, thus serving to clamp the respective cable to provide strain relief therefor, and also seal around the respective cable to minimize or eliminate dust and water intrusion. In this manner, the second chamber 62 formed by the base portion 10 and the second housing 60 protects the wiring harness connections for the first, second, and third electrical connectors 44, 47, 50 are protected from water and dust impingement, and also protects the first, second, and third mating connectors 201, 202, 203 from the vehicle 200 from water and dust impingement. Furthermore, the interaction first, second, and third strain relief apertures 74, 75, 76 serves to isolate the respective cables from mechanical strain that may be induced on one or more of the cables.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. Alternative or additional functional relationships or physical connections may be present in an embodiment of the present disclosure.

The term "module" and related terms such as controller, microcontroller, control, control unit, processor, etc. refer to one or various combinations of Application Specific Integrated Circuit(s) (ASIC), Field-Programmable Gate Array(s) (FPGA), electronic circuit(s), central processing unit(s), e.g., microprocessor(s) and associated non-transitory memory component(s) in the form of memory and storage devices (read only, programmable read only, random access, hard drive, etc.). Communication may be accomplished using a direct wired point-to-point link, a networked communication bus link, a wireless link, or another communication link. Communication includes exchanging data signals, including, for example, electrical signals via a conductive medium; electromagnetic signals via air; optical signals via optical waveguides; etc. The data signals may include discrete, analog and/or digitized analog signals representing inputs from sensors, actuator commands, and communication between controllers.

The concepts described herein prove an enclosure for an electronics device such as a telematics module that is capable of providing resistance to intrusion by dust and moisture, and vibration damping while offering simple installation options. The enclosure includes a hooded design via the first and second housings that resists intrusion by pressurized water spray, salt mist, heat degradation, and vibration validations.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the claims.

What is claimed is:

1. An enclosure for a telematics module, the enclosure comprising:
    a base portion, a first housing, a second housing, a first gasket, a vibration attenuating insert, a first electrical connector, a second electrical connector, and a third electrical connector;
    wherein the first housing is sealably assembled onto the base portion with the first gasket interposed therebetween, and wherein the first housing and the base portion define a first chamber that is arranged to house the telematics module and the vibration attenuating insert;
    wherein the second housing and the base portion define a second chamber;
    wherein the first housing includes a first end;
    wherein the first chamber adjoins the second chamber at the first end of the first housing;
    wherein the first electrical connector, the second electrical connector, and the third electrical connector are arranged in the first end of the first housing;
    wherein a first end of the first electrical connector, a first end of the second electrical connector, and a first end of the third electrical connector are disposed in the first chamber;
    wherein a second end of the first electrical connector, a second end of the second electrical connector, and a second end of the third electrical connector are disposed in the second chamber;
    wherein the second housing and the base portion cooperate to define a first aperture, a second aperture, and a third aperture that are arranged on a second end of the second housing;
    wherein the second housing and the base portion form a first sealable strain relief portion associated with the first aperture;
    wherein the second housing and the base portion form a second sealable strain relief portion associated with the second aperture; and
    wherein the second housing and the base portion form a third sealable strain relief portion associated with the third aperture.

2. The enclosure of claim 1, wherein the first electrical connector comprises a multi-pin connector.

3. The enclosure of claim 1, wherein the second electrical connector comprises a radiofrequency (RF) connector.

4. The enclosure of claim 1, wherein the third electrical connector comprises a radiofrequency (RF) connector.

5. The enclosure of claim 1, wherein the first gasket is fabricated from a silicone material.

6. The enclosure of claim 1, further comprising a second gasket; wherein the second housing is assembled onto the base portion with the second gasket interposed therebetween.

7. The enclosure of claim 1, further comprising a tether; wherein the tether is attached to the base portion and the second housing, and wherein the tether is disposed internally to the second chamber.

8. The enclosure of claim 1, further comprising a drain, wherein the drain is disposed on the base portion within the second chamber.

9. The enclosure of claim 1, wherein the first aperture accommodates a wiring harness cable, wherein the second aperture accommodates a first coaxial cable, and wherein the third aperture accommodates a second coaxial cable.

10. An enclosure for a telematics module, the enclosure comprising:
a base portion, a first housing, a second housing, a first gasket, a vibration attenuating insert, a first electrical connector, and a second electrical connector;
wherein the first housing is sealably assembled onto the base portion with the first gasket interposed therebetween, and wherein the first housing and the base portion define a first chamber that is arranged to house the telematics module and the vibration attenuating insert;
wherein the second housing and the base portion define a second chamber;
wherein the first housing includes a first end;
wherein the first chamber adjoins the second chamber at the first end of the first housing; and
wherein the first electrical connector and the second electrical connector are sealably arranged in the first end of the first housing, including a first end of the first electrical connector and a first end of the second electrical connector being disposed in the first chamber, and a second end of the first electrical connector and a second end of the second electrical connector being disposed in the second chamber.

11. The enclosure of claim 10, further comprising:
wherein the second housing and the base portion cooperate to define a first aperture and a second aperture that are arranged on a second end of the second housing;
wherein the second housing and the base portion form a first sealable strain relief portion associated with the first aperture; and
wherein the second housing and the base portion form a second sealable strain relief portion associated with the second aperture.

12. The enclosure of claim 11, wherein the first aperture accommodates a wiring harness cable, wherein the second aperture accommodates a first coaxial cable.

13. The enclosure of claim 10, wherein the first electrical connector comprises a multi-pin connector.

14. The enclosure of claim 10, wherein the second electrical connector comprises a radiofrequency (RF) connector.

15. The enclosure of claim 10, wherein the first gasket is fabricated from a silicone material.

16. The enclosure of claim 10, further comprising a second gasket; wherein the second housing is assembled onto the base portion with the second gasket interposed therebetween.

17. The enclosure of claim 10, further comprising a tether; wherein the tether is attached to the base portion and the second housing, and wherein the tether is disposed internal to the second chamber.

18. The enclosure of claim 11, further comprising a drain, wherein the drain is disposed on the base portion within the second chamber.

19. An enclosure for a solid-state electronics module, the enclosure comprising:
a base portion, a first housing, a second housing, a first gasket, a vibration attenuating insert, a first electrical connector, and a second electrical connector;
wherein the first housing is sealably assembled onto the base portion with the first gasket interposed therebetween, and wherein the first housing and the base portion define a first chamber that is arranged to house the electronics module and the vibration attenuating insert;
wherein the second housing and the base portion define a second chamber;
wherein the first housing includes a first end;
wherein the first chamber adjoins the second chamber at the first end of the first housing; and
wherein the first electrical connector and the second electrical connector are sealably arranged in the first end of the first housing, including a first end of the first electrical connector and a first end of the second electrical connector being disposed in the first chamber, and a second end of the first electrical connector and a second end of the second electrical connector being disposed in the second chamber.

20. The enclosure of claim 19, further comprising:
wherein the second housing and the base portion cooperate to define a first aperture and a second aperture that are arranged on a second end of the second housing;
wherein the second housing and the base portion form a first sealable strain relief portion associated with the first aperture; and
wherein the second housing and the base portion form a second sealable strain relief portion associated with the second aperture.

* * * * *